US012772378B2

(12) United States Patent
Kuwabara et al.

(10) Patent No.: US 12,772,378 B2
(45) Date of Patent: Oct. 20, 2026

(54) WIRING SUBSTRATE HAVING MULTIPLE BUILD-UP PARTS

(71) Applicant: IBIDEN CO., LTD., Ogaki (JP)

(72) Inventors: Masashi Kuwabara, Ibi-gun (JP); Susumu Kagohashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 261 days.

(21) Appl. No.: 18/625,662

(22) Filed: Apr. 3, 2024

(65) Prior Publication Data

US 2024/0341033 A1 Oct. 10, 2024

(30) Foreign Application Priority Data

Apr. 5, 2023 (JP) ................................ 2023-061424

(51) Int. Cl.
*H05K 1/11* (2006.01)
*H05K 3/40* (2006.01)

(52) U.S. Cl.
CPC .......... *H05K 1/115* (2013.01); *H05K 3/4038* (2013.01); *H05K 2201/0245* (2013.01); *H05K 2201/096* (2013.01); *H05K 2201/09827* (2013.01); *H05K 2201/09845* (2013.01); *H05K 2203/06* (2013.01)

(58) Field of Classification Search
CPC .... H05K 1/115; H05K 3/4038; H05K 1/0296; H05K 2201/0245; H05K 2201/096; H05K 2201/09827; H05K 2201/09845; H05K 2203/06
USPC ......... 174/261, 255, 250; 361/795, 767, 790
See application file for complete search history.

(56) References Cited

U.S. PATENT DOCUMENTS 4,665,468 A * 5/1987 Dohya ................ H10W 70/611 257/E23.173
4,685,033 A * 8/1987 Inoue .................. H10W 70/611 29/829
4,821,142 A * 4/1989 Ushifusa ................ C03C 3/066 361/792
5,110,664 A * 5/1992 Nakanishi ........... H05K 3/4605 428/209

(Continued)

FOREIGN PATENT DOCUMENTS

JP 2015-126103 A 7/2015

*Primary Examiner* — Timothy J Thompson
*Assistant Examiner* — Michael F Mcallister
(74) *Attorney, Agent, or Firm* — Finnegan, Henderson, Farabow, Garrett & Dunner, LLP

(57) ABSTRACT

A wiring substrate includes a first build-up part including first insulating and conductor layers, and via conductors, and a second build-up part including second insulating and conductor layers. The first build-up part is laminated on the second build-up part. The minimum wiring width of wirings in the first conductor layers is smaller than the minimum wiring width of wirings in the second conductor layers. The minimum inter-wiring distance of the wirings in the first conductor layers is smaller than the minimum inter-wiring distance of the wirings in the second conductor layers. The first conductor layers and via conductors include a first layer and a second layer. The first layer of each via conductor is covering inner wall surface in a via opening and has a first portion and a second portion. The first portion has a portion formed closer to the center of the via opening than the second portion.

20 Claims, 14 Drawing Sheets

(56) References Cited

U.S. PATENT DOCUMENTS

| | | | | | |
|---|---|---|---|---|---|
| 5,396,034 | A * | 3/1995 | Fujita | H05K 3/4605 | |
| | | | | 361/767 | |
| 10,643,936 | B2 * | 5/2020 | Hu | H10P 72/74 | |
| 10,818,584 | B2 * | 10/2020 | Hu | H10P 72/74 | |
| 11,309,252 | B2 * | 4/2022 | Hu | H10W 70/611 | |
| 12,176,277 | B2 * | 12/2024 | Hu | H10P 72/74 | |
| 12,309,943 | B2 * | 5/2025 | Lau | H05K 1/0298 | |
| 2015/0102510 | A1 * | 4/2015 | Kaneda | H05K 1/0298 | |
| | | | | 174/250 | |
| 2021/0272898 | A1 * | 9/2021 | Takagi | H10W 20/42 | |

* cited by examiner

WIRING SUBSTRATE HAVING MULTIPLE BUILD-UP PARTS

CROSS-REFERENCE TO RELATED APPLICATIONS

The present application is based upon and claims the benefit of priority to Japanese Patent Application No. 2023-061424, filed Apr. 5, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-126103 describes a printed wiring board that includes a first conductor layer, an insulating layer formed on the first conductor layer, and a second conductor layer formed on the insulating layer. The first conductor layer and the second conductor layer are connected by via conductors that fill through holes that penetrate the insulating layer in a thickness direction. The entire contents of this publication are incorporated herein by reference.

SUMMARY OF THE INVENTION

According to one aspect of the present invention, a wiring substrate includes a first build-up part including first insulating layers, first conductor layers, and via conductors, and a second build-up part including second insulating layers and second conductor layers and formed such that the first build-up part is laminated on the second build-up part, that the minimum wiring width of wirings in the first conductor layers is smaller than the minimum wiring width of wirings in the second conductor layers, and that the minimum inter-wiring distance of the wirings in the first conductor layers is smaller than the minimum inter-wiring distance of the wirings in the second conductor layers. The first build-up part is formed such that the first conductor layers and the via conductors include a first layer and a second layer formed on the first layer such that the first layer in each of the via conductors is covering an inner wall surface in a respective via opening and has a first portion and a second portion electrically connected to the first portion and that the first portion has a portion formed closer to the center of the respective via opening than the second portion.

According to another aspect of the present invention, a method for manufacturing a wiring substrate includes forming a first build-up part including first insulating layers, first conductor layers, and via conductors, and forming a second build-up part including second insulating layers and second conductor layers such that the second build-up part is laminated on the first build-up part, that the minimum wiring width of wirings in the first conductor layers is smaller than the minimum wiring width of wirings in the second conductor layers, and that the minimum inter-wiring distance of the wirings in the first conductor layers is smaller than the minimum inter-wiring distance of the wirings in the second conductor layers. The first build-up part is formed such that the first conductor layers and the via conductors include a first layer and a second layer formed on the first layer such that the first layer in each of the via conductors is covering an inner wall surface in a respective via opening and has a first portion and a second portion electrically connected to the first portion and that the first portion has a portion formed closer to the center of the respective via opening than the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
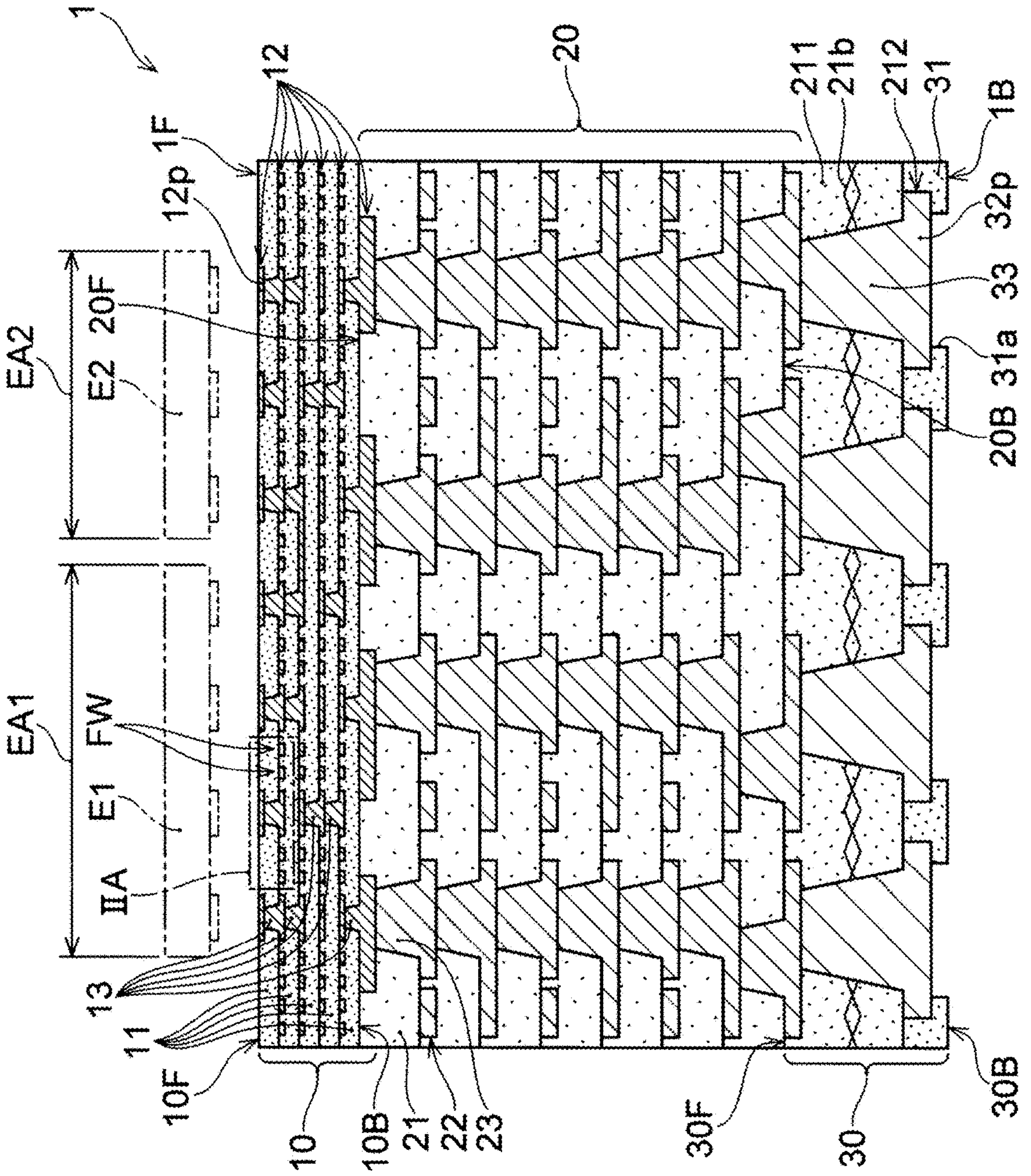
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings. FIG. 1 is a cross-sectional view illustrating a wiring substrate 1, which is an example of a wiring substrate according to an embodiment of the present invention. A laminated structure, the number of conductor layers, the number of insulating layers of a wiring substrate are not limited to the laminated structure of the wiring substrate 1 in FIG. 1.

The wiring substrate 1 of the embodiment has a laminated structure that includes a first build-up part 10 and a second build-up part 20, which are each formed of alternately laminated conductor layers and insulating layers. The first build-up part 10 has, as two surfaces orthogonal to a thickness direction (lamination direction) thereof, one surface (10F) and the other surface (10B) on the opposite side with respect to the one surface (10F). The second build-up part 20 has, as two surfaces orthogonal to a thickness direction (lamination direction) thereof, one surface (20F) and the other surface (20B) on the opposite side with respect to the one surface (20F). The wiring substrate 1 has two surfaces (a first surface (1F) and a second surface (1B) on the opposite side with respect to the first surface (1F)) orthogonal to a thickness direction thereof. The wiring substrate 1 of the present embodiment is preferably a coreless wiring substrate that does not include a core layer.

In the example illustrated in FIG. 1, the wiring substrate 1 further includes a third build-up part 30, which is formed of an insulating layer and a conductor layer, on a side opposite to the first build-up part 10 side of the second build-up part 20. The third build-up part 30 has, as two surfaces orthogonal to a thickness direction (lamination direction) thereof, one surface (30F) and the other surface (30B) on the opposite side with respect to the one surface (30F). In the illustrated example, the one surface (10F) of the first build-up part 10 forms the first surface (1F), and the other surface (30B) of the third build-up part 30 forms the second surface (1B). When the wiring substrate 1 does not have the third build-up part 30, the second surface (1B) can be formed by the other surface (20B) of the second build-up part 20.

The first build-up part 10 includes relatively fine wirings and can have relatively dense circuit wirings. In the example of FIG. 1, the first build-up part 10 includes alternately laminated insulating layers 11 (first insulating layers 11) and conductor layers 12 (first conductor layers 12). Conductor layers 12 facing each other with one first insulating layer 11 in between are connected by via conductors 13 (first via conductors 13).

As illustrated, the via conductors 13 are formed to each have a tapered shape that is reduced in diameter from the other surface (10B) toward the one surface (10F) of the first build-up part 10. Here, for convenience, the term "reduced in diameter" is used. However, the shape of each of the via conductors 13 is not necessarily limited to a circular shape. The term "reduced in diameter" simply means that a diameter (a longest distance between two points on an outer circumference of a horizontal cross section) of each of the via conductors 13 is reduced. A via diameter of each of the via conductors 13 (a diameter of each of the via conductors 13 at a surface in contact with the conductor layer 12 on the other surface (10B) side of the each of the via conductors 13) can be about 10 μm.

The one surface (10F) of the first build-up part 10 is formed of a surface of a first conductor layer 12 and a surface of a first insulating layer 11 exposed from patterns of the first conductor layer 12. The first conductor layers 12 are each patterned to have predetermined conductor patterns. In the illustrated example, the first conductor layer 12 forming the one surface (10F) is formed to have patterns including multiple conductor pads (12*p*). As illustrated, the conductor layer 12 that forms the other surface (10B) of the first build-up part 10 and is in contact with the second build-up part 20 may have a thickness different from the other conductor layers 12 of the first build-up part 10.

The conductor pads (12*p*) form the outermost surface (first surface (1F)) of the wiring substrate 1 and form a component mounting surface of the wiring substrate 1 to which external electronic components can be connected. The component mounting surface of the wiring substrate 1 can have multiple component mounting regions. For example, as illustrated in the example of FIG. 1, two component mounting regions (EA1, EA2) can be formed corresponding to regions where electronic components (E1, E2) are to be mounted. In mounting external electronic components to the wiring substrate 1 in the illustrated example, the exposed conductor pads (12*p*) can be electrically and mechanically connected to the external electronic components, for example, via a conductive bonding material such as solder (not illustrated) interposed between the conductor pads (12*p*) and connection pads of the external electronic components. In this case, for example, a plating layer (not illustrated) or the like including a nickel layer and a tin layer may be formed in advance on surfaces of the conductor pads (12*p*). When the multiple component mounting regions are formed, conductor patterns may be formed in the conductor layers 12 in the first build-up part 10 such that conductor pads (12*p*) positioned in adjacent component mounting regions can be electrically connected to each other. In using the wiring substrate 1, multiple electronic components to be mounted can be electrically connected to each other via the first build-up part 10 in short paths. As a result, in using the wiring substrate 1, it may be possible to improve flexibility in designing circuits via multiple electronic components that can be mounted.

Examples of the electronic components (E1, E2) that can be mounted on the wiring substrate 1 include electronic components such as active components such as semiconductor integrated circuit devices and transistors. Specifically, for example, the electronic components can each be an integrated circuit such as a logic chip incorporating a logic circuit, a processing unit such as an MPU (Micro Processor Unit), or a memory element such as an HBM (High Bandwidth Memory).

The first insulating layers 11 of the first build-up part 10 can be formed, for example, using an insulating resin such as an epoxy resin or a phenol resin. The first insulating layers 11 may contain one of a fluorine resin, a liquid crystal polymer (LCP), a fluoroethylene resin (PTFE), a polyester resin (PE), and a modified polyimide resin (MPI).

Examples of conductors forming the first conductor layers 12 and the first via conductors 13 include copper, nickel, and the like, and copper is preferably used. In the example illustrated in FIG. 1, the first conductor layers 12 and the first via conductors 13 are each illustrated as having a single-layer structure. However, the first conductor layers 12 and the first via conductors 13 can each have a multilayer structure. For example, as will be described later in detail with reference to FIGS. 2A and 2B, the first conductor layers 12 and the first via conductors 13 can each have a multilayer structure that includes a metal film layer (preferably a sputtering film layer) and a plating film layer (preferably an electrolytic plating film layer).

The first conductor layers 12 can have fine wirings (FW), which are high-density wirings with relatively small wiring widths and inter-wiring distances (shortest distances between adjacent wirings). The fine wirings (FW) can have smallest pattern widths and inter-pattern distances among wirings of the wiring substrate 1. In the illustrated example, among the multiple first conductor layers 12 included in the first build-up part 10, four conductor layers 12 have fine wirings (FW), which are high-density wirings. However, the number of the first conductor layers 12 having fine wirings (FW) in the first build-up part 10 is not limited.

The fine wirings (FW) included in the first build-up part 10 have smaller wiring widths and inter-wiring distances than wiring widths and inter-wiring distances of wirings included in conductor layers 22 (second conductor layers 22) in the second build-up part 20 to be described later. Specifically, for example, the fine wirings (FW) have a minimum wiring width of 3 μm or less and a minimum inter-wiring distance of 3 μm or less. Since the first build-up part 10 has the fine wirings (FW), it may be possible to provide wirings with more appropriate characteristics for electrical signals that can be transmitted via the wirings in the first build-up part 10. Further, it is thought that it may be possible to increase a density of the wirings in the first build-up part 10 and to improve a degree of freedom in wiring design. From the same point of view, an aspect ratio of the fine wirings (FW) is, for example, 2.0 or more and 4.0 or less.

The first conductor layers 12 that include the fine wirings (FW) in the first build-up part 10 can each have a thickness of, for example, 7 μm or less. The first insulating layers 11 in the first build-up part 10 each have a thickness of, for example, about 7.5-10 μm. In this case, the first insulating layers 11 preferably do not each contain a core material (reinforcing material) formed of a glass fiber, an aramid fiber, or the like.

As illustrated in FIG. 1, the first build-up part 10 is in contact with the one surface (20F) side of the second build-up part 20. That is, the other surface (10B) of the first build-up part 10, which is formed of surfaces of an insulating layer 11 and a conductor layer 12, faces the one surface (20F) of the second build-up part 20. Similar to the first build-up part 10, the second build-up part 20 includes alternately laminated insulating layers 21 (second insulating layers 21) and conductor layers 22 (second conductor layers). Via conductors 23 penetrating the second insulating layers 21 are formed in the second insulating layers 21. The conductor layers 22 are each patterned to have predetermined conductor patterns. As illustrated in FIG. 1, the second build-up part 20 does not include a core layer.

As illustrated in FIG. 1, in the wiring substrate 1, the third build-up part 30 may be further laminated on the other surface (20B) side of the second build-up part 20. The other surface (20B) of the second build-up part 20, which is formed of a surface of a second conductor layer 22 and a surface of a second insulating layer 21 exposed from patterns of the second conductor layer 22, faces the one surface (30F) of the third build-up part 30.

The third build-up part 30 includes an insulating layer 211 (third insulating layer 211) and a conductor layer 212 (third conductor layer 212). In the insulating layer 211, via conductors 33 are formed that penetrate the insulating layer 211 and connect the conductor layer 212 and the conductor layer 22 that forms the other surface (20B) of the second build-up part 20.

In the example of FIG. 1, the third build-up part 30 further includes a solder resist layer 31 that covers surfaces of the insulating layer 211 and the conductor layer 212. The solder resist layer 31 is formed using, for example, a photosensitive polyimide resin or epoxy resin. Openings (31*a*) are formed in the solder resist layer 31, and conductor pads (32*p*) of the conductor layer 212 are exposed from the openings (31*a*).

The insulating layers 21 of the second build-up part 20 can be formed using the same insulating resin as the insulating layers 11. The insulating layers (11, 21) in the build-up parts may contain the same insulating resin or insulating resins different from each other. The insulating layers 21 may each contain a core material (reinforcing material) formed of a glass fiber or an aramid fiber. In the illustrated example, the insulating layer 211 of the third build-up part 30 contains a core material (21*b*) formed of a glass fiber. The insulating layers (21, 211) can each further contain an inorganic filler formed of fine particles of silica ($SiO_2$), alumina, mullite, or the like.

Similar to the conductor layers 12 and the via conductors 13, the conductor layers 22 of the second build-up part 20 and the conductor layer 212 of the third build-up part 30, as well as the via conductors (23, 33), can be formed using any metal such as copper or nickel. As illustrated in FIG. 1, similar to the via conductors 13 in the first build-up part 10, the via conductors 23 included in the second build-up part 20 and the via conductors 33 included in the third build-up part 30 are formed to each have a tapered shape that is reduced in diameter from the second surface (1B) side toward the first surface (1F) side of the wiring substrate 1.

Wiring widths and inter-wiring distances of wirings included in the second conductor layers 22 of the second build-up part 20 and the third conductor layer 212 of the third build-up part 30 are larger than the wiring widths and the inter-wiring distances of the wirings included in the first conductor layers 12 of the first build-up part 10. The second conductor layers 22 are formed thicker than the first conductor layers 12, and each have a thickness of, for example, about 10 μm or more. The second conductor layers 22 of the second build-up part 20 do not include wiring patterns that are as fine as the fine wirings (FW) of the first build-up part 10. For example, the wirings included in the second conductor layers 22 have a minimum wiring width of about 4 μm and a minimum inter-wiring distance of about 6 μm. An aspect ratio of the wirings included in the second conductor layers 22 may be substantially the same as the aspect ratio of the fine wirings (FW) of the conductor layers 12, for example, about 2.0 or more and 4.0 or less. A via diameter of each of the via conductors 23 (a diameter of each of the via conductors 23 at a surface in contact with the conductor layer 22 on the other surface (20B) side of the each of the via conductors 23) is about 50 μm.

In the illustrated wiring substrate 1, for example, the insulating layer 211 and the conductor layer 212 of the third build-up part 30 are both formed thicker than the insulating layers 21 and the conductor layers 22 in the second build-up part 20. For example, the insulating layer 211 has a thickness of about 100 μm or more and 200 μm or less. Further, the conductor layer 212 has a thickness of about 20 μm. A via diameter of each of the via conductors 33 (a diameter of each of the via conductors 3 at a surface in contact with the conductor layer 212 on the other surface (30B) side of the each of the via conductors 33) is about 100 μm.

Similar to the first conductor layers 12 and the first via conductors 13, the conductor layers (22, 212) and the via conductors (23, 33) may be formed to each have a multilayer structure, for example, can each have a multilayer structure that includes a metal film layer (preferably a sputtering film layer or an electroless plating film layer) and a plating film layer (preferably an electrolytic plating film layer). The second build-up part 20 and the third build-up part 30 do not include fine wiring patterns such as the fine wirings (FW) of the first build-up part 10. In such a case, of the multilayer structure of each of the conductor layers 22 and the via conductors 23 and the conductor layer 212 and the via conductors 33, the metal film layer can be an electroless plating film layer formed by an electroless plating film, in particular, an electroless copper plating film layer, and the plating film layer can be an electrolytic plating film layer formed by an electrolytic plating film, in particular, an electrolytic copper plating film layer.

The second surface (1B) of the wiring substrate 1 on the opposite side with respect to the component mounting surface of the wiring substrate 1 can be a connection surface that is to be connected to an external element such as an external wiring substrate (for example, a motherboard of any electrical device) when the wiring substrate 1 itself is mounted on the external element. The conductor pads (32*p*) can be connected to any substrate, electrical component, mechanism component, or the like.

Figure 2A:
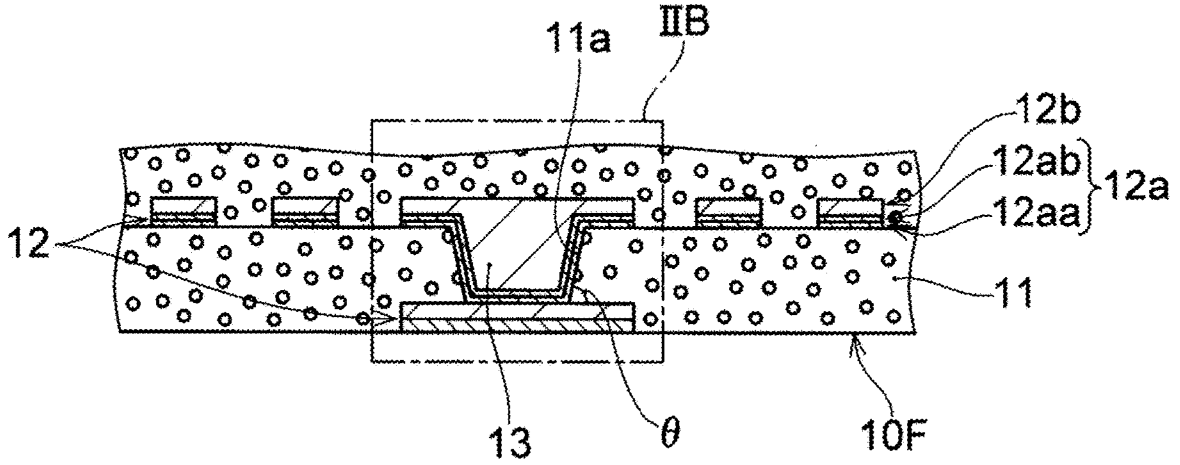
FIG. 2A is a partial enlarged view of FIG. 1 illustrating an example of a wiring substrate according to an embodiment of the present invention.
Figure 2B:
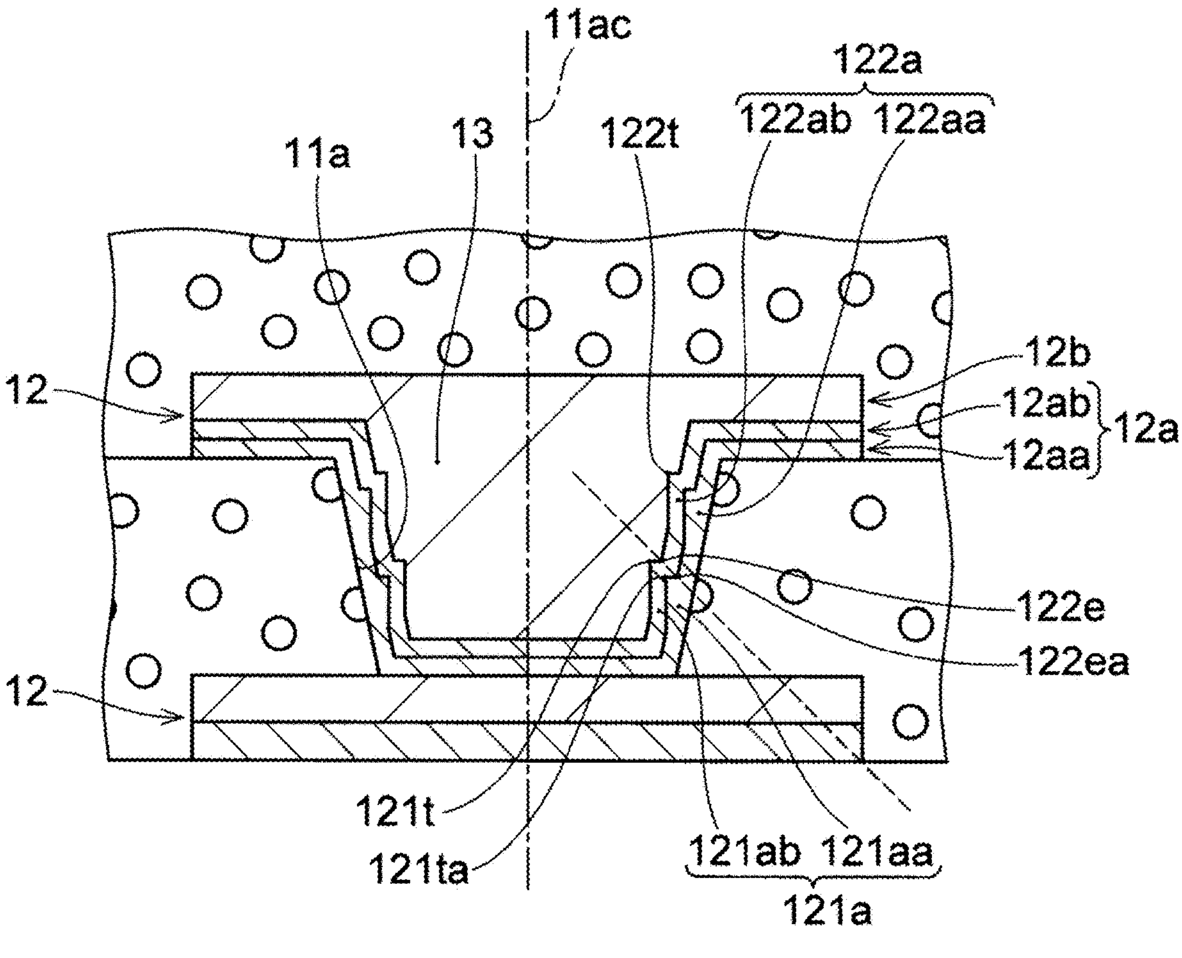
FIG. 2B is a partial enlarged view of FIG. 2 illustrating an example of a wiring substrate according to an embodiment of the present invention.

With reference to FIG. 2A, which is an enlarged view of a region (IIA) surrounded by a one-dot chain line in FIG. 1, and FIG. 2B, which is an enlarged view of a region (IIB) surrounded by a one-dot chain line in FIG. 2A, a first conductor layer 12 and a first via conductor 13 integrally formed with the first conductor layer 12 in the first build-up part 10 will be described in detail. In FIGS. 2A and 2B, the up-down direction (the thickness direction of the wiring substrate 1) is reversed compared to FIG. 1, with the one surface (10F) positioned on a lower side in the drawing and the other surface (10B) positioned on an upper side. Hereinafter, in describing the wiring substrate 1 with reference to FIGS. 2A and 2B, the one surface (10F) side is referred to as "lower" or a "lower side" and the other surface (10B) side is referred to as "upper" or an "upper side."

As illustrated in FIG. 2A, a via opening (11*a*) penetrating the first insulating layer 11 is formed in the first insulating layer 11. The first via conductor 13 that connects first conductor layers 12 facing each other with the first insulating layer 11 in between is formed by filling the via opening (11*a*) with a conductor. Specifically, as illustrated, a first layer (12*a*) (which can be a metal film layer formed by sputtering) and a second layer (12*b*) (which can be an electrolytic plating film layer) that form the first conductor layer 12 fill the via opening (11*a*) to form the first via conductor 13. The first conductor layer 12 and the first via conductor 13 are integrally formed. The via opening (11*a*) formed in the first insulating layer 11 is also referred to as a first via opening (11*a*).

The first layer (12*a*) covers an entire inner wall surface of the via opening (11*a*) and can function as a power feeding layer when the second layer (12*b*) is formed by electrolytic plating. In the illustrated example, the first layer (12*a*) has a two-layer structure including a lower layer (12*aa*) and an upper layer (12*ab*). The lower layer (12*aa*) can be a copper alloy sputtering film layer formed by sputtering using an alloy containing copper (for example, an alloy containing copper, silicon, and aluminum) as a target. The upper layer (12*ab*) can be a copper sputtering film layer formed by sputtering using copper as a target. When the first layer (12*a*) that covers the inner wall surface of the via opening (11*a*) has the structure that includes the lower layer (12*aa*) and the upper layer (12*ab*), it may be possible that adhesion between the inner wall surface of the via opening (11*a*) and the first layer (12*a*) (that is, adhesion between the inner wall surface of the via opening (11*a*) and the first via conductor 13) is improved. In particular, when the lower layer (12*aa*) is a copper alloy sputtering film layer as described above, the inner wall surface of the via opening (11*a*) and the lower layer (12*aa*) can have relatively good adhesion. The via opening (11*a*) can be formed at a position in the first insulating layer 11 where the via conductor 13 is to be formed, for example, by irradiating laser from an upper surface of the insulating layer 11. A diameter of the via opening (11*a*) can be larger on a laser irradiation side and become smaller on the opposite side (deep side) with respect to the laser irradiation side. Therefore, the via opening (11*a*) can be formed to have a larger upper diameter and a smaller lower diameter. As illustrated in FIGS. 2A and 2B, the inner wall surface of the via opening (11*a*) is inclined from an upper side to a lower side of the insulating layer 11. An angle (inclination angle) ($\theta$) of the inner wall surface of the via opening (11*a*) with respect to an upper surface of the conductor layer 12 on the opposite side with respect to the via opening (11*a*) (within the insulating layer 11) is, for example, 70 degrees or more and 90 degrees or less.

For example, the via opening (11*a*) can be formed such that an aspect ratio of the via conductor 13 ((height from an upper surface of the lower conductor layer 12 to a lower surface of the upper conductor layer, which are in contact with the via conductor 13)/(diameter of the via conductor 13 at the upper surface of the lower conductor layer 12)) is about 0.5 or more and about 1.0 or less.

Specifically, as will be described later regarding a method for manufacturing the wiring substrate, after the via opening (11*a*) is formed in the first insulating layer 11 by laser irradiation, the inner wall of the via opening (11*a*) is subjected to a desmear treatment. The desmear treatment is performed with a dry process. When the first insulating layer 11 contains an inorganic filler, due to the desmear treatment, the filler particles exposed from the inner wall of the via opening (11*a*) are formed to have flat parts along the inner wall surface. Specifically, portions of the filler particles that protrude from a surface of an insulating resin forming the first insulating layer 11 to an inner side of the via opening (11*a*) can be removed by the desmear treatment, and the inner wall surface can be formed substantially smooth by the surface of the resin and the flat parts of the filler particles. That is, the entire inner wall surface of the via opening (11*a*) can be formed relatively smooth as a surface having a predetermined angle with respect to a bottom surface of the via opening (11*a*) (upper surface of the conductor layer 12). Even when the first insulating layer 11 contains the inorganic filler, the inner wall surface of the via opening (11*a*) can be formed smooth with relatively small roughness. Since the inner wall surface of the via opening (11*a*) is formed relatively smooth, the surface of the first via conductor 13 that is in contact with the inner wall surface of the via opening (11*a*) is also formed relatively smooth. Therefore, transmission loss of a signal transmitted via the first via conductor 13 can be kept relatively small.

As illustrated in FIG. 2B, the first layer (12*a*) forming the via conductor 13 has a first portion (121*a*) and a second portion (122*a*). Specifically, the lower layer (12*aa*) forming the first layer (12*a*) has a lower-layer first portion (121*aa*) and a lower-layer second portion (122*aa*), and the upper layer (12*ab*) has an upper-layer first portion (121*ab*) and an upper-layer second portion (122*ab*). The first portion (121*a*) of the first layer (12*a*) includes the lower-layer first portion (121*aa*) and the upper-layer first portion (121*ab*). The second portion (122*a*) of the first layer (12*a*) includes the lower-layer second portion (122*aa*) and the upper-layer second portion (122*ab*). The first portion (121*a*) and the second portion (122*a*) can be formed at the same time when the first layer (12*a*) is formed.

More specifically, as illustrated, the first portion (121*a*) is a portion that includes a front end part (121*t*) and extends to a bottom side of the via opening (11*a*), and the second portion (122*a*) is a portion that includes a front end part (122*t*) and extends to the opposite side with respect to the bottom surface of the via opening (11*a*). The first portion (121*a*) and the second portion (122*a*) are continuous and electrically connected at a rear end part (122*e*) of the second portion (122*a*). The lower-layer first portion (121*aa*) includes a lower-layer front end part (121*ta*) and is continuous with the lower-layer second portion (122*aa*) at a lower-layer rear end part (122*ea*) of the lower-layer second portion (122*aa*).

A part of the first portion (121*a*) is formed closer to a center (11*ac*) of the via opening (11*a*) than the second portion (122*a*) is. Specifically, as illustrated, the front end part (121*t*) included in the first portion (121*a*) is formed closer to the center (11*ac*) of the via opening (11*a*) than the rear end part (122*e*) of the second portion (122*a*) is. Further, in the lower layer (12*aa*), the lower-layer front end part (121*ta*) is formed closer to the center (11*ac*) of the via opening (11*a*) than the lower-layer rear end part (122*ea*) is. It is thought that, by having a structure in which a part of the first portion (121*a*) is formed closer to the center (11*ac*) of the via opening (11*a*) than the second portion (122*a*) is, the first layer (12*a*) is relatively increased in strength and is unlikely to break.

The first layer (12*a*) is formed along the inner wall surface of the via opening (11*a*). As described above, the inner wall surface of the via opening (11*a*) is formed of the surface of the resin forming the first insulating layer 11 and the flat parts of the filler particles and can be formed substantially smooth with relatively small roughness. Therefore, surfaces of the first layer (12*a*) formed in contact with the inner wall surface of the via opening (11*a*) (a surface in contact with the inner wall surface and a surface in contact with the second layer (12*b*)) are also substantially smooth surfaces. That is, the first portion (121*a*) and the second portion (122*a*) of the first layer (12*a*) have substantially smooth surfaces. Here, a "substantially smooth surface" means that any continuous range of the surface of the first layer (12*a*) covering the inner wall surface of the via opening (11*a*), excluding the front end parts (121*t*, 122*t*) and the rear end part (122*e*), is relatively smooth. It is thought that, since the first layer (12*a*) has a substantially smooth surface, transmission loss when a high frequency signal is transmitted via the first via conductor 13 can be kept relatively small.

As illustrated, the first layer (12*a*) covering the inner wall surface of the via opening (11*a*) can have a substantially step-like shape. The "substantially step-like shape" in the description herein means that, as a contour in a cross-sectional shape of the first layer (12*a*), multiple portions each extending substantially perpendicular to the bottom surface (upper surface of the conductor layer 12) of the via opening (11*a*) are present at different positions in an extension direction of the bottom surface of the via opening (11*a*). In this way, since the first layer (12*a*) in the first via conductor 13 has a substantially step-like shape, due to an anchor effect on the second layer (12*b*) formed on the first layer (12*a*), adhesion between the first layer (12*a*) and the second layer (12*b*) can be improved. The lower layer (12*aa*) and the upper layer (12*ab*) that form the first layer (12*a*) each have a substantially step-like shape. Further, in the inner wall surface of the via opening (11*a*), which is formed of the surface of the resin forming the first insulating layer 11 and the flat parts of the filler particles, it may be possible that steps are formed at boundaries between the surface of the resin and the flat parts of the filler particles.

It may be possible that the upper surface of the first conductor layer 12 is a highly flat polished surface with relatively small roughness. Since the surface of the conductor layer 12 is a polished surface with relatively small roughness, it may be possible that good high-frequency transmission characteristics can be obtained in the first build-up part 10.

Next, with reference to FIGS. 3A-3M, a method for manufacturing a wiring substrate according to an embodiment of the present invention is described using a case where the wiring substrate 1 illustrated in FIG. 1 is manufactured as an example. Structural elements formed in the manufacturing method to be described below can be formed using the materials exemplified as the materials of the corresponding structural elements in the description of the wiring substrate 1 in FIG. 1, unless otherwise specified. In the following description about the method for manufacturing the wiring structure 1, a side closer to a support substrate (GS) is referred to as "lower" or a "lower side," and a side farther from the support substrate (GS) is referred to as "upper" or an "upper side." Therefore, of each of the elements of the wiring structure 1, a surface facing the support substrate (GS) is referred to as a "lower surface," and a surface facing the opposite side with respect to the support substrate (GS) is also referred to as an "upper surface." The wiring substrate 1 can be formed by manufacturing the first build-up part 10 on the support substrate (GS), and manufacturing the second build-up part 20 on the first build-up part 10 and the third build-up part 30 on the second build-up part 20 (see FIG. 1).

Figure 3A:
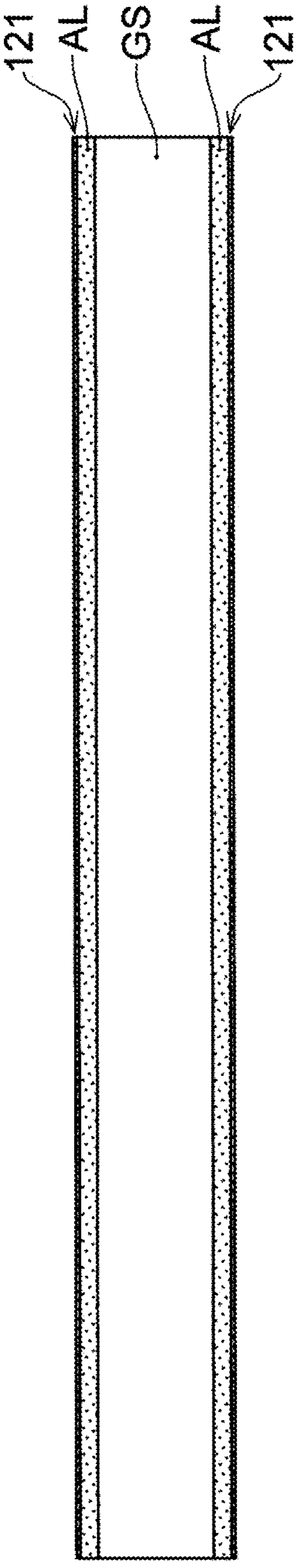
FIG. 3A illustrates an example of a method for manufacturing a wiring substrate according to an embodiment of the present invention.

First, as illustrated in FIG. 3A, the support substrate (GS) having good surface flatness, such as a glass substrate, is prepared. On both sides of the support substrate (GS), a metal film layer 121 is formed via an adhesive layer (AL) containing, for example, an azobenzene-based polymer adhesive that can be attached or detached by irradiation with light. The metal film layer 121 is, for example, a metal film (preferably copper film) layer formed by electroless plating or sputtering or the like. It is also possible that the metal film layer 121 is formed of a relatively thin metal foil.

Figure 3B:
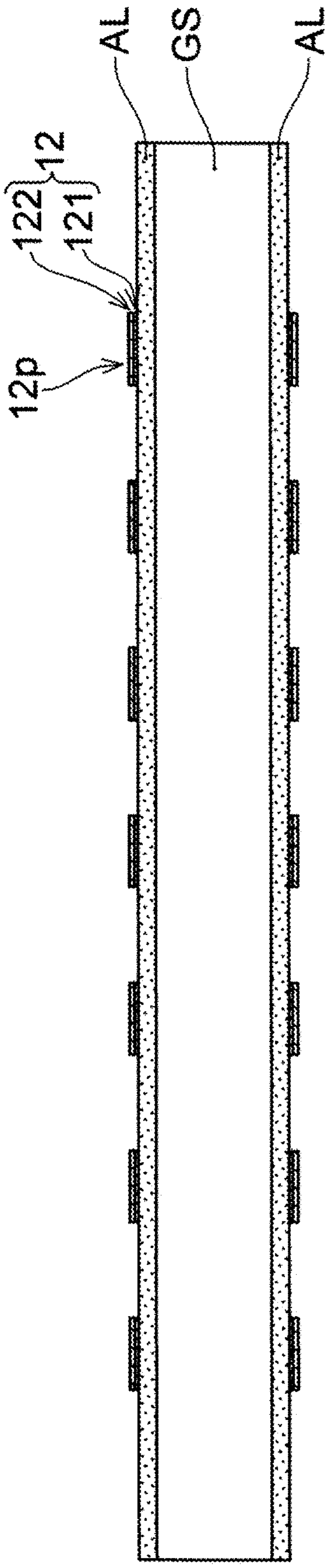
FIG. 3B illustrates an example of a method for manufacturing a wiring substrate according to an embodiment of the present invention.

Next, as illustrated in FIG. 3B, a conductor layer 12 that has multiple conductor pads (12*p*) and includes the metal film layer 121 and a plating film layer 122 is formed via the adhesive layer (AL) on the support substrate (GS). In forming the conductor layer 12, for example, a plating resist is formed on the metal film layer 121, and openings are formed in the plating resist according to formation regions of patterns of the conductor pads (12*p*), for example, by photolithography. Next, the plating film layer 122 is formed in the openings by electrolytic plating using the metal film layer 121 as a seed layer. After the formation of the plating film layer 122, the plating resist is removed, and the metal film layer 121 exposed by the removal of the plating resist is etched and the state illustrated in FIG. 2B is formed.

Figure 3C:
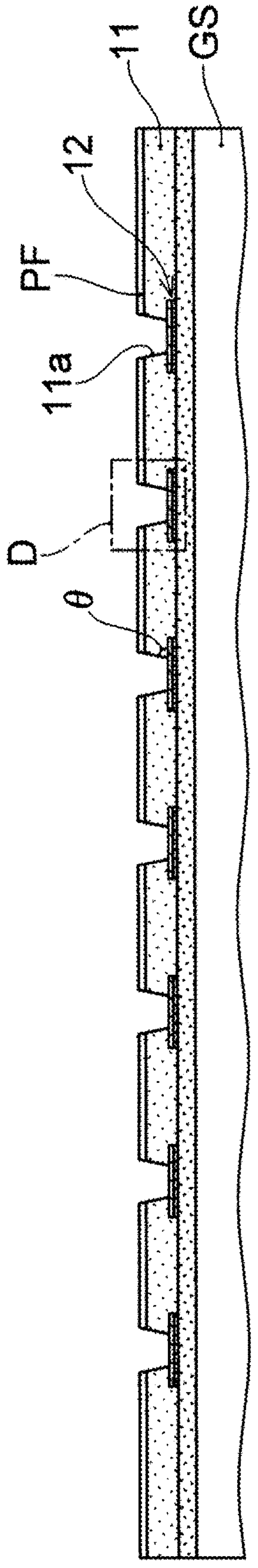
FIG. 3C illustrates an example of a method for manufacturing a wiring substrate according to an embodiment of the present invention.

Next, as illustrated in FIG. 3C, an insulating layer 11 covering the conductor layer 12 is laminated. As the insulating layer 11, for example, an insulating resin such as an epoxy resin or a phenol resin can be used. A fluorine resin, a liquid crystal polymer (LCP), a fluoroethylene resin (PTFE), a polyester resin (PE), or a modified polyimide resin (MPI) also may be used. The insulating layer 11 can be formed by thermocompressing these resins molded into a film-like shape onto the conductor layer 12. On the insulating layer 11, a protective film (PF) completely covering the upper surface of the insulating layer 11 is formed. The protective film (PF) is, for example, a film formed of polyethylene terephthalate (PET). A release agent can be interposed between the protective film (PF) and the upper surface of the insulating layer 11.

Next, via openings (11*a*) are formed at formation positions of via conductors 13 (see FIG. 1) in the insulating layer 11, for example, by irradiation with $CO_2$ laser, excimer laser, or the like. The via openings (11*a*) penetrating the protective film (PF) and the insulating layer 11 are formed. The via openings (11*a*) can each be formed in a shape that is reduced in diameter from the upper surface of the insulating layer 11 toward a bottom surface (the upper surface of the conductor layer 12). The via openings (11*a*) can be formed such that, for example, an angle (θ) of the inner wall surface of each of the via openings (11*a*) with respect to the upper surface of the conductor layer 12 on the opposite side with respect to the via openings (11*a*) (within the insulating layer 11) is, for example, 70 degrees or more and 90 degrees or less. After the formation of the via openings (11*a*) using laser, inner surfaces (bottom surfaces and inner wall surfaces) of the via openings (11*a*) can be subjected to a desmear treatment. The desmear treatment is preferably performed with a dry desmear treatment using a plasma gas (for example, containing tetrafluoromethane). The desmear treatment also can be performed while the surface of the insulating layer 11 is protected with the protective film (PF) having been formed on the surface of the insulating layer 11.

In FIG. 3C, and FIGS. 3F-3M to be referenced below, the laminate formed on the surface on one side of the support substrate (GS) is illustrated, and illustration of the laminate that can be formed on the surface on the opposite side is omitted. However, on the surface on the opposite side, conductor layers and insulating layers may be formed in the same manner and number as those on the surface on the one side or in different manner and number from those on the surface on the one side, or it is also possible that such conductor layers and insulating layers are not formed.

Figure 3D:
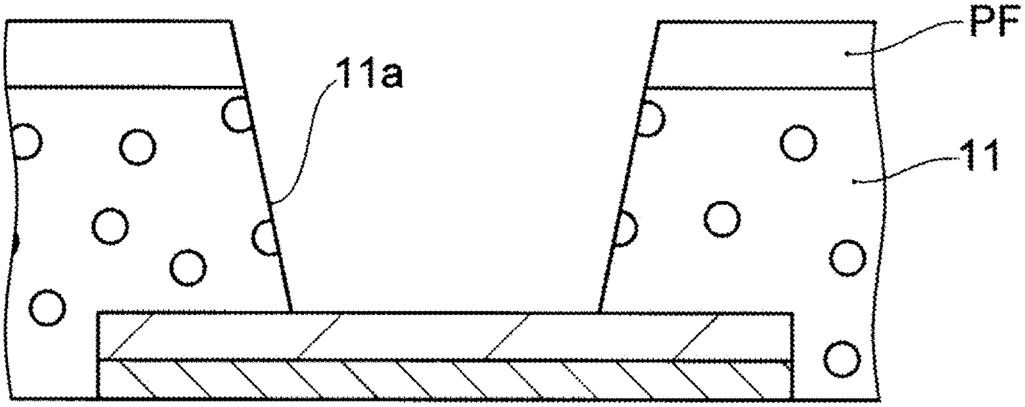
FIG. 3D illustrates an example of a method for manufacturing a wiring substrate according to an embodiment of the present invention.

As illustrated in FIG. 3D (which is an enlarged view of a region (D) surrounded by a one-dot chain line in FIG. 3C), the inner wall surface of the via opening (11*a*) can be smoothed by adjusting treatment conditions (gas components, gas concentration, treatment temperature, treatment time, pressure, and the like) in the desmear treatment using a plasma gas. Specifically, when the insulating layer 11 contains an inorganic filler, protruding portions of the filler particles protruding from the inner wall surface of the via opening (11*a*) can be selectively removed by the desmear treatment using a plasma gas. Flat parts are formed in the filler particles. As a result, the inner wall surface of the via opening (11*a*) can form an inner wall surface as a substantially smooth surface where the surface formed by the resin contained in the insulating layer 11 and the surface formed by the flat parts of the filler particles are substantially the same.

When the inner wall surface of the via opening (11*a*) is formed substantially smooth with the surface formed by the resin and the surface formed by the flat parts of the filler particles as described above, it may be possible that, depending on treatment conditions of the desmear treatment, steps are formed at boundaries between the surface of the resin and the flat parts of the filler particles. After the desmear treatment in the via opening (11*a*), the protective film (PF) is removed from the upper surface of the insulating layer 11

Figure 3E:
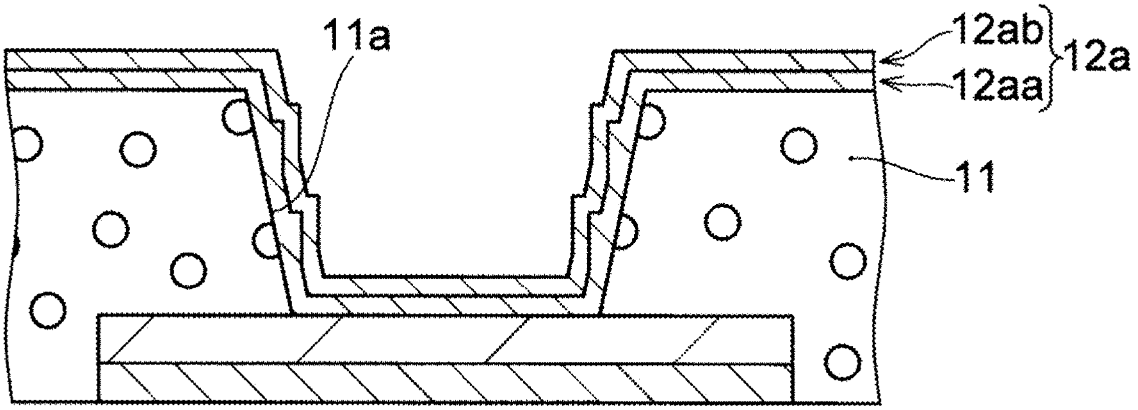
FIG. 3E illustrates an example of a method for manufacturing a wiring substrate according to an embodiment of the present invention.

Next, as illustrated in FIG. 3E, a first layer (12*a*) forming a conductor layer 12 (see FIG. 3G) is formed by sputtering on the inner wall surface of the via opening (11*a*) and on the upper surface of the insulating layer 11. Specifically, first, a lower layer (12*aa*) is formed by sputtering on the upper surface of the insulating layer 11, on the inner wall surface of the via opening (11*a*), and on the upper surface of the conductor layer 12 that forms the bottom surface of the via opening (11*a*). The lower layer (12*aa*) can be formed, for example, by sputtering using an alloy containing copper (for example, an alloy containing copper, silicon, and aluminum) as a target. In this case, the lower layer (12*aa*) can be simultaneously formed in a range where the lower layer (12*aa*) is to be formed so as to have a substantially step-like shape on the inner wall surface. Since steps are formed at boundaries between the surface of the resin and the flat parts of the filler particles on the inner wall surface of the via opening (11*a*), it may be possible that a lower layer (12*aa*) having a substantially step-like shape can be relatively easily formed.

Subsequently, an upper layer (12*ab*) is formed by sputtering to cover the lower layer (12*aa*). The upper layer (12*ab*) is formed, for example, by sputtering using copper as a target. In this case, when the lower layer (12*aa*) has a substantially step-like shape, the upper layer (12*ab*) can be formed along the substantially step-like shape of the lower layer (12*aa*). A surface of the upper layer (12*ab*) to be formed has a substantially smooth surface reflecting the substantially smooth inner wall surface of the via opening (11*a*).

Figure 3F:
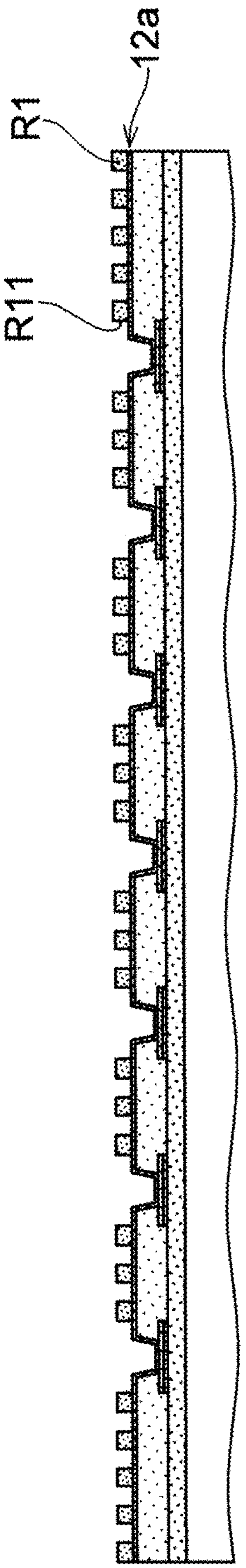
FIG. 3F illustrates an example of a method for manufacturing a wiring substrate according to an embodiment of the present invention.

As illustrated in FIG. 3F, a plating resist (R1) having openings (R11) corresponding to conductor patterns to be formed is provided on the metal film (first layer) (12*a*). In FIGS. 3F-3J, the first layer (12*a*) having the two-layer structure illustrated in FIG. 3E is illustrated as having a single-layer structure for ease of viewing.

Figure 3G:
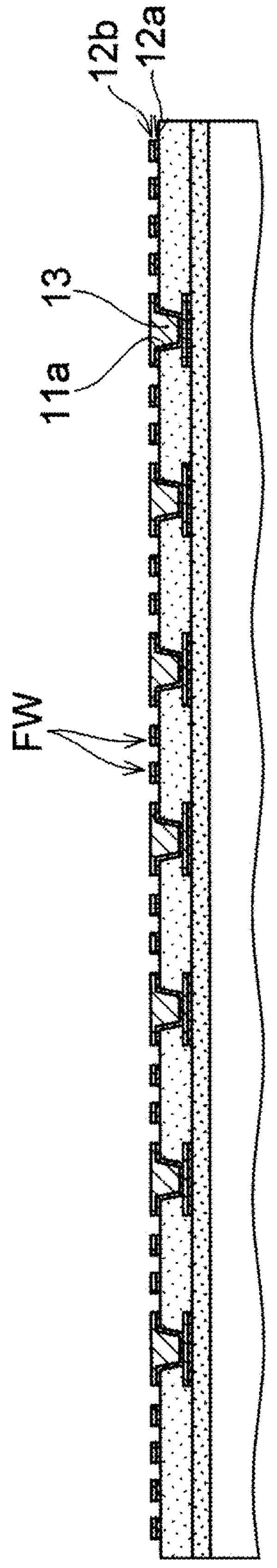
FIG. 3G illustrates an example of a method for manufacturing a wiring substrate according to an embodiment of the present invention.

As illustrated in FIG. 3G, by electrolytic plating using the first layer (12*a*) as a power feeding layer, a second layer (12*b*), which is an electrolytic plating film layer, is formed in the openings (R11) of the plating resist (R1). Next, after the plating resist (R1) is removed, a portion of the first layer (12*a*) that is not covered by the second layer (12*b*) is removed by etching or the like. As a result, a conductor layer 12 that is formed of the first layer (12*a*) and the second layer (12*b*) and includes fine wirings (FW) is formed. Further, via conductors 13 are formed by completely filling the via openings (11*a*) with the second layer (12*b*) which is an electrolytic plating film.

Figure 3H:
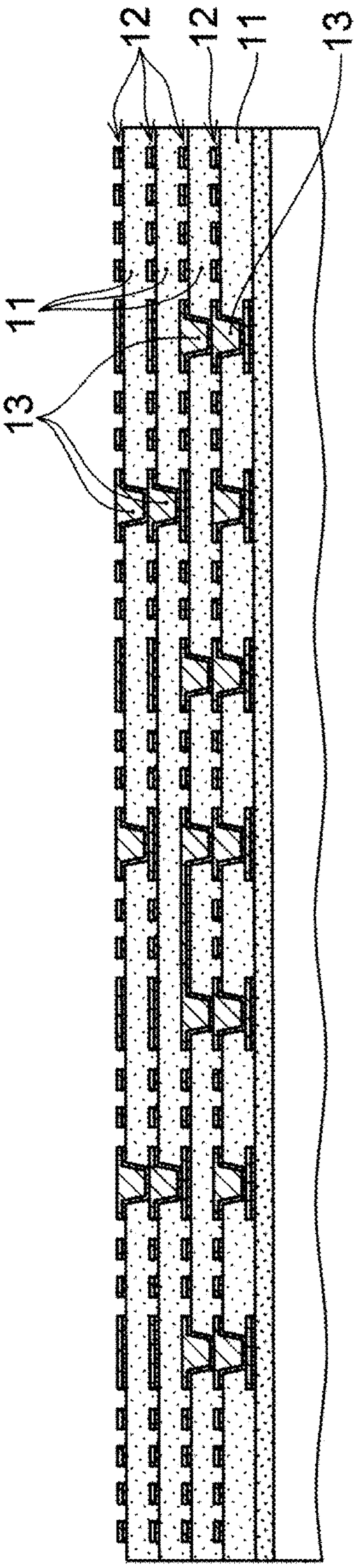
FIG. 3H illustrates an example of a method for manufacturing a wiring substrate according to an embodiment of the present invention.

Subsequently, as illustrated in FIG. 3H, using the same methods as the methods for forming the insulating layer 11, the conductor layer 12 and the via conductors 13 described above, on the conductor layer 12 and the insulating layer 11, a desired number of insulating layers 11 and conductor layers 12, and via conductors 13 penetrating the respective insulating layers, are formed.

Figure 3I:
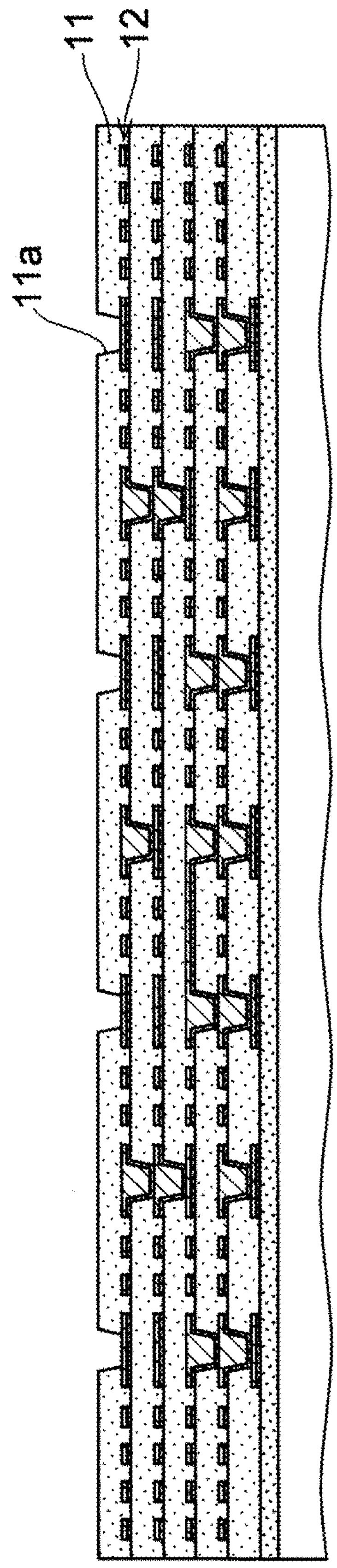
FIG. 3I illustrates an example of a method for manufacturing a wiring substrate according to an embodiment of the present invention.

Next, as illustrated in FIG. 3I, an outermost insulating layer 11 among the insulating layers 11 of the first build-up part 10 (see FIG. 1) is formed on an upper side of the conductor layer 12. After that, via openings (11*a*) for forming via conductors 13 are formed by laser processing in the insulating layer 11 at positions corresponding to formation locations of the via conductors 13 (see FIG. 1).

Figure 3J:
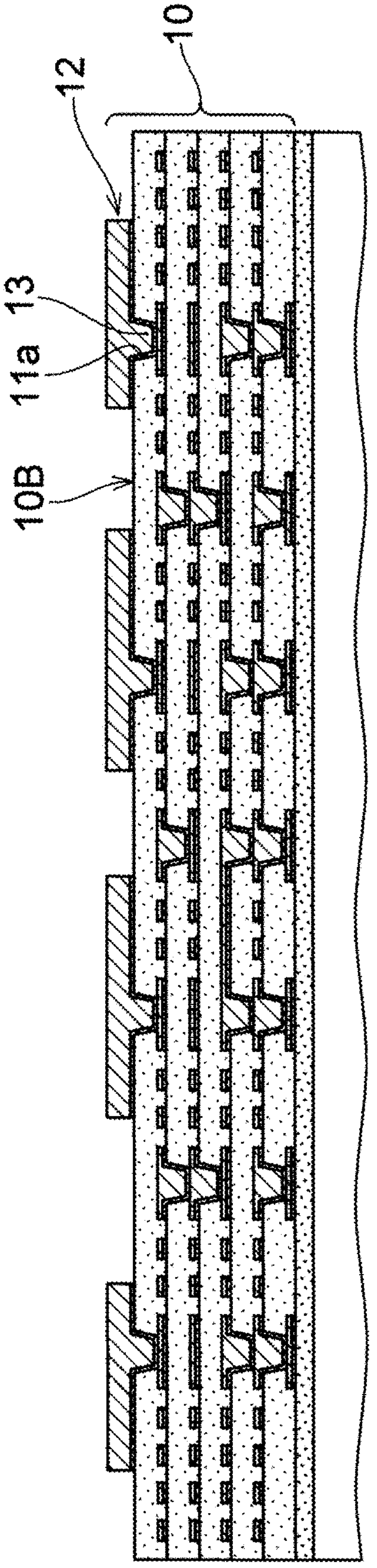
FIG. 3J illustrates an example of a method for manufacturing a wiring substrate according to an embodiment of the present invention.

Subsequently, as illustrated in FIG. 3J, a conductor layer 12 that forms the other surface (10B) is formed simultaneously with the via conductors 13 filling the via openings (11*a*) using any method for forming conductor patterns, such as a semi-additive method. Formation of the first build-up part 10 on the support substrate (GS) is completed.

Figure 3K:
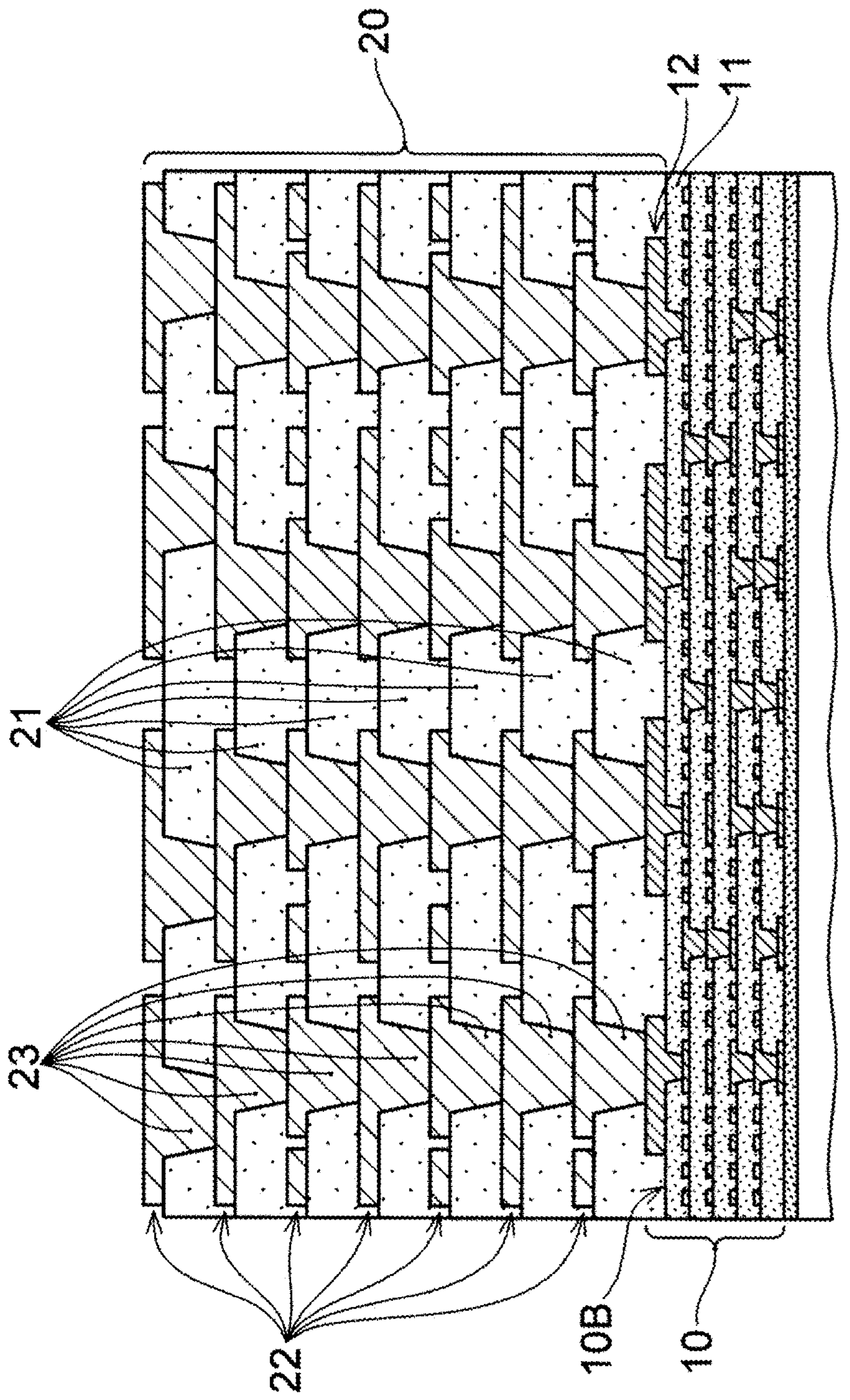
FIG. 3K illustrates an example of a method for manufacturing a wiring substrate according to an embodiment of the present invention.
Figure 3L:
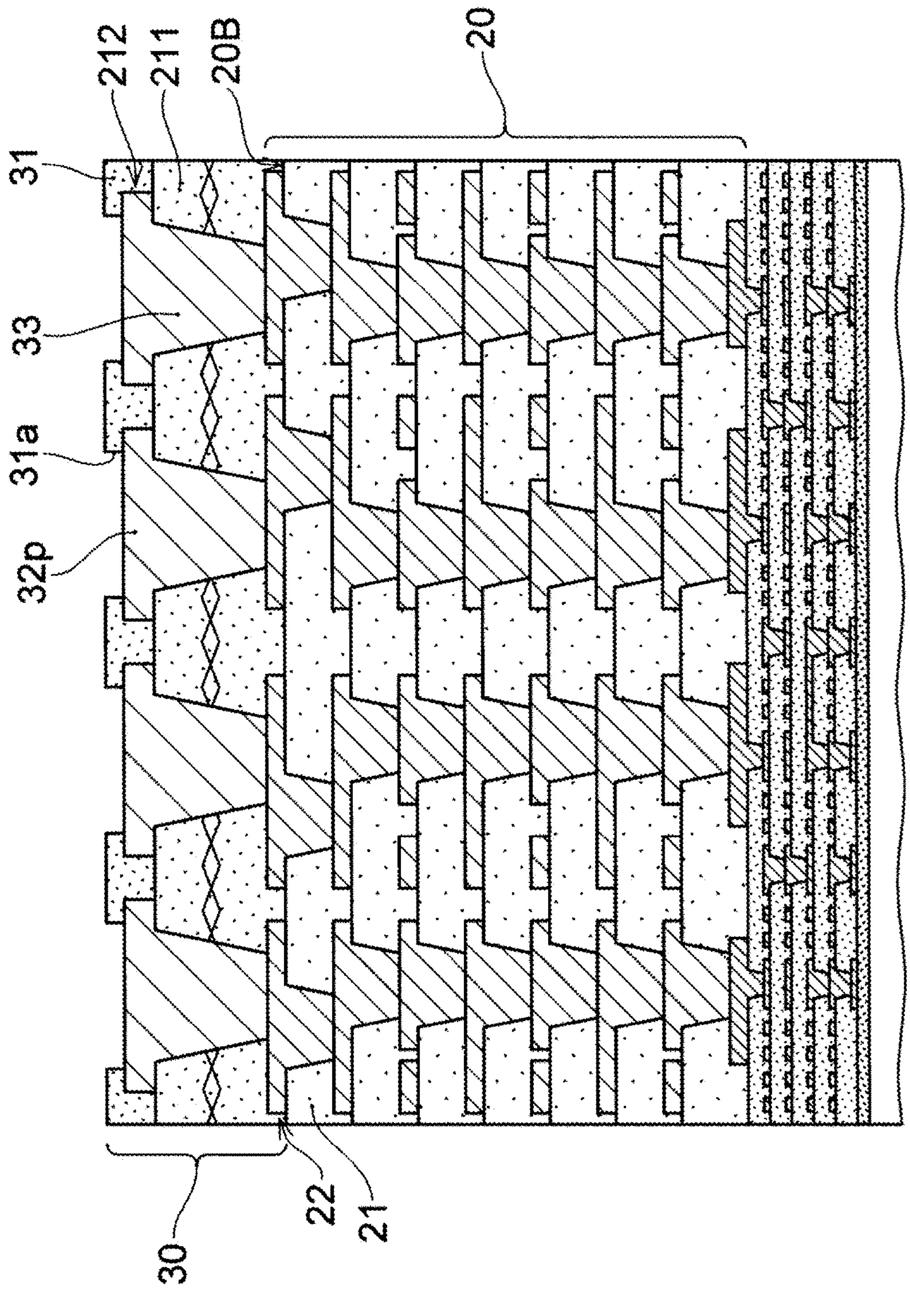
FIG. 3L illustrates an example of a method for manufacturing a wiring substrate according to an embodiment of the present invention.
Figure 3M:
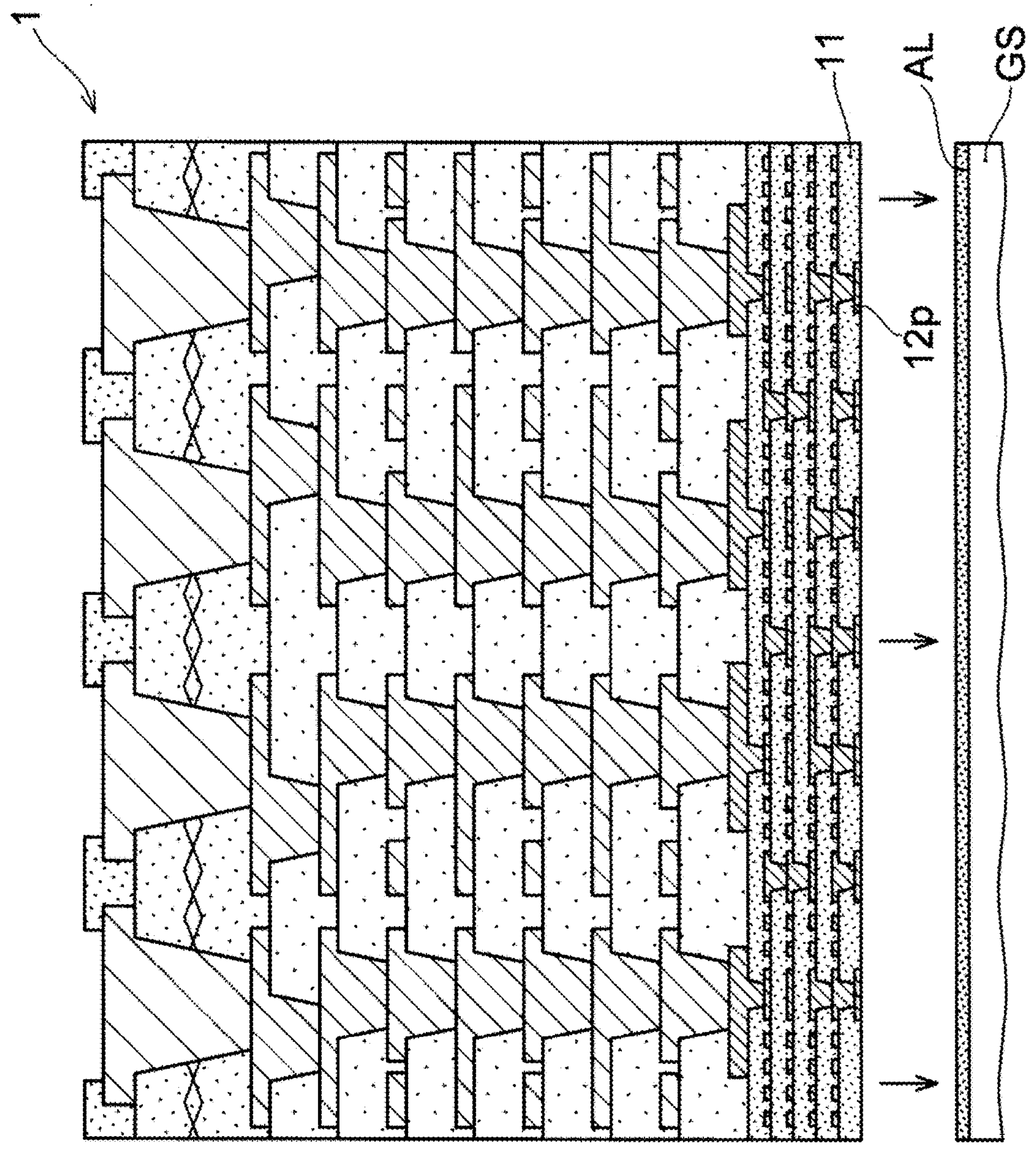
FIG. 3M illustrates an example of a method for manufacturing a wiring substrate according to an embodiment of the present invention.

Subsequently, as illustrated in FIG. 3K, the second build-up part 20 is formed on the conductor layer 12 and insulating layer 11, which form the other surface (10B) of the first build-up part 10. An insulating layer 21 can be formed by thermocompression bonding of a film-like resin. A conductor layer 22 can be formed using any method of forming conductor patterns, such as a semi-additive method. A desired number of insulating layers 21 and conductor layers 22 and via conductors 23 penetrating the respective insulating layers 21 are formed. In FIGS. 3K-3M, similar to FIG. 1, the conductor layers are each illustrated as having a single-layer structure.

As illustrated in FIG. 3L, the third build-up part 30 is formed on the insulating layer 21 and conductor layer 22 that form the other surface (20B) of the second build-up part 20. The insulating layer 211, the conductor layer 212, and the via conductors 33 penetrating the insulating layer 211 are formed using the same methods as the methods for forming the insulating layers 21, the conductor layers 22, and the via conductors 23. As an insulating resin forming the insulating layer 211, a prepreg containing an insulating resin such as an epoxy resin or a BT resin impregnated in a reinforcing material (core material) formed of a glass fiber can be used. Next, the solder resist layer 31 is formed by forming a photosensitive epoxy resin or polyimide resin layer on the surfaces of the insulating layer 211 and the conductor layer 212. Then, using a photolithography technology, the openings (31*a*) that respectively define the conductor pads (32*p*) are formed.

Next, as illustrated in FIG. 3M, the support substrate (GS) is removed. The lower surfaces of the conductor pads (12*p*) and the lower surface of the insulating layer 11 are exposed. In removing the support substrate (GS), the adhesive layer (AL) is irradiated with, for example, laser and is softened, and then the support substrate (GS) is peeled off from the conductor pads (12*p*) and the insulating layer 11. The adhesive layer (AL) that can remain on the surfaces of the conductor pads (12*p*) and the insulating layer 11 can be removed by washing. The wiring substrate 1 illustrated in FIG. 1 is completed.

A wiring substrate according to an embodiment of the present invention is not limited to those having the structures illustrated in the drawings and those having the structures, shapes, and materials exemplified herein. As described above, each of the build-up parts in the wiring substrate may have any number of insulating layers and conductor layers. Further, a method for manufacturing a wiring substrate according to an embodiment of the present invention is not limited to the method described with reference to FIGS. 3A-3M, and the conditions, processing order, and the like of the method may be arbitrarily modified. Further, it is also possible that a specific process is omitted or another process is added. For example, a plating layer including a nickel layer and a tin layer may be formed on the surfaces of the conductor pads (12*p*) exposed after the support substrate (GS) is removed.

In the printed wiring board described in Japanese Patent Application Laid-Open Publication No. 2015-126103, inner walls of the through holes filled with the via conductors have complicated uneven surfaces. It is thought that roughness of surfaces of the via conductors in contact with the inner walls of the through holes may be large and transmission loss of a high frequency signal may be relatively large.

A wiring substrate according to an embodiment of the present invention has a first surface and a second surface on opposite side with respect to the first surface, and includes: a first build-up part that includes alternately laminated first insulating layers and first conductor layers, and first via openings penetrating the first insulating layers, and first via conductors filling the first via openings; and a second build-up part that includes alternately laminated second insulating layers and second conductor layers. The first build-up part is laminated on the first surface side of the second build-up part. A minimum wiring width of wirings included in the first conductor layers is smaller than a minimum wiring width of wirings included in the second conductor layers. A minimum inter-wiring distance of the wirings included in the first conductor layers is smaller than a minimum inter-wiring distance of the wirings included in the second conductor layers. The first conductor layers and the first via conductors each have a first layer and a second layer formed on the first layer. The first layer covering an inner wall surface of each of the first via openings has a first portion and a second portion, which each have a substantially smooth surface. The first portion and the second portion are electrically connected. A part of the first portion is positioned closer to a center of each of the first via openings than the second portion is.

According to an embodiment of the present invention, a part of the first portion of the first layer that covers the inner wall surface of each of the first via openings is positioned closer to the center of each of the first via openings than the second portion is. Therefore, it is thought that the first layer is relatively strong in strength and unlikely to break. Further, since the first layer has the first portion and the second portion, which each have a substantially smooth surface, transmission loss when a high frequency signal is transmitted to the first via conductors can be kept relatively small.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a first build-up part comprising a plurality of first insulating layers, a plurality of first conductor layers, and a plurality of via conductors; and a second build-up part comprising a plurality of second insulating layers and a plurality of second conductor layers and formed such that the first build-up part is laminated on an outermost second insulating layer in the second build-up part, that a minimum wiring width of wirings in the first conductor layers is smaller than a minimum wiring width of wirings in the second conductor layers, and that a minimum inter-wiring distance of the wirings in the first conductor layers is smaller than a minimum inter-wiring distance of the wirings in the second conductor layers, wherein the first build-up part is formed such that the first conductor layers and the via conductors include a first layer and a second layer formed on the first layer, that the first layer and the second layer are integrally forming the first conductor layers and via conductors comprising the first layer and the second layer, that the plurality of first conductor layers includes an outermost first conductor layer embedded in the outermost second insulating layer in the second build-up part and integrally formed with at least one outermost via conductor, that the first layer in each of the via conductors is covering an inner wall surface in a respective via opening and has a first portion and a second portion electrically connected to the first portion, that the first portion has a portion formed closer to a center of the respective via opening than the second portion, and that the wirings in the first conductor layers have a minimum wiring width of 3 μm or less and a minimum inter-wiring distance of 3 μm or less.

2. The wiring substrate according to claim 1, wherein the first build-up part is formed such that the wirings in the first conductor layers have an aspect ratio in a range of 2.0 to 4.0.

3. The wiring substrate according to claim 1, wherein the second build-up part is formed such that the wirings in the second conductor layers have a minimum wiring width of 4 μm or more and a minimum inter-wiring distance of 6 μm or more.

4. The wiring substrate according to claim 1, wherein the first build-up part is formed such that the first portion in the first layer of each of the via conductors has a front end part formed closer to the center of the respective via opening than a rear end part of the second portion in the first layer of each of the via conductors.

5. The wiring substrate according to claim 1, wherein the first build-up part is formed such that the first portion and second portion in the first layer of each of the via conductors are formed in a same process.

6. The wiring substrate according to claim 1, wherein the first build-up part is formed such that the first layer formed on the inner wall surface has a step-like shape.

7. The wiring substrate according to claim 1, wherein the first build-up part is formed such that the first layer of each of the via conductors includes a lower layer covering the inner wall surface and an upper layer formed on the lower layer and that the lower layer has a lower-layer first portion in the first portion and a lower-layer second portion in the second portion.

8. The wiring substrate according to claim 7, wherein the lower-layer first portion has a lower-layer front end part formed closer to the center of the respective via opening than a lower-layer rear end part of the lower-layer second portion.

9. The wiring substrate according to claim 7, wherein the lower layer has a step-like shape.

10. The wiring substrate according to claim 1, wherein the first build-up part is formed such that the first insulating layers include resin and filler particles having flat parts such that the flat parts of the filler particles and the resin are forming the inner wall surface in the respective via opening.

11. The wiring substrate according to claim 10, wherein the first build-up part is formed such that the inner wall surface in the respective via opening has steps formed between the resin and the flat parts.

12. The wiring substrate according to claim 1, wherein the first build-up part is formed such that the respective via opening has a shape reduced in diameter in a direction from the second build-up part toward the first build-up part.

13. The wiring substrate according to claim 1, wherein the first build-up part is formed such that each of the first conductor layers has a thickness of 7 μm or less, and the second build-up part is formed such that each of the second conductor layers has a thickness of 10 μm or more.

14. The wiring substrate according to claim 1, further comprising:

a third build-up part formed on the second build-up part on an opposite side with respect to the first build-up part and comprising a third insulating layer and a third conductor layer.

15. The wiring substrate according to claim 2, wherein the second build-up part is formed such that the wirings in the second conductor layers have a minimum wiring width of 4 μm or more and a minimum inter-wiring distance of 6 μm or more.

16. The wiring substrate according to claim 2, wherein the first build-up part is formed such that the first portion in the first layer of each of the via conductors has a front end part formed closer to the center of the respective via opening than a rear end part of the second portion in the first layer of each of the via conductors.

17. The wiring substrate according to claim 2, wherein the first build-up part is formed such that the first portion and second portion in the first layer of each of the via conductors are formed in a same process.

18. The wiring substrate according to claim 2, wherein the first build-up part is formed such that the first layer formed on the inner wall surface has a step-like shape.

19. A method for manufacturing a wiring substrate, comprising:

forming a first build-up part comprising a plurality of first insulating layers and a plurality of first conductor layers, and a plurality of via conductors; and forming a second build-up part comprising a plurality of second insulating layers and a plurality of second conductor layers such that an outermost second insulating layer in the second build-up part is laminated on the first build-up part, that a minimum wiring width of wirings in the first conductor layers is smaller than a minimum wiring width of wirings in the second conductor layers, and that a minimum inter-wiring distance of the wirings in the first conductor layers is smaller than a minimum inter-wiring distance of the wirings in the second conductor layers, wherein the first build-up part is formed such that the first conductor layers and the via conductors includes a first layer and a second layer formed on the first layer, that the first layer and the second layer are integrally forming the first conductor layers and via conductors comprising the first layer and the second layer, that the plurality of first conductor layers includes an outermost first conductor layer embedded in the outermost second insulating layer in the second build-up part and integrally formed with at least one outermost via conductor, that the first layer in each of the via conductors is covering an inner wall surface in a respective via opening and has a first portion and a second portion electrically connected to the first portion, that the first portion has a portion formed closer to a center of the respective via opening than the second portion, and that the wirings in the first conductor layers have a minimum wiring width of 3 μm or less and a minimum inter-wiring distance of 3 μm or less.

20. The method of claim 19, wherein the forming the first build-up part includes forming the plurality of first insulating layers comprising resin and filler particles and forming a plurality of via openings for the via conductors in the first insulating layers such that protruding portions of the filler particles protruding from inner wall surfaces in the via openings are removed and that the resin and the filler particles having flat parts form the inner wall surfaces in the via openings.

* * * * *